(12) United States Patent
Vellaisamy et al.

(10) Patent No.: US 9,812,545 B2
(45) Date of Patent: Nov. 7, 2017

(54) ELECTRONIC DEVICE FOR DATA STORAGE AND A METHOD OF PRODUCING AN ELECTRONIC DEVICE FOR DATA STORAGE

(71) Applicant: City University of Hong Kong, Kowloon (HK)

(72) Inventors: A. L. Roy Vellaisamy, Kowloon (HK); Ye Zhou, Kowloon (HK); Su-Ting Han, Kowloon (HK)

(73) Assignee: City University of Hong Kong, Hong Kong (HK)

( * ) Notice: Subject to any disclaimer, the term of this patent is extended or adjusted under 35 U.S.C. 154(b) by 266 days.

(21) Appl. No.: 14/528,044

(22) Filed: Oct. 30, 2014

(65) Prior Publication Data

US 2016/0126329 A1    May 5, 2016

(51) Int. Cl.
| | | |
|---|---|---|
| H01L 29/06 | (2006.01) | |
| H01L 29/49 | (2006.01) | |
| H01L 21/28 | (2006.01) | |
| H01L 29/423 | (2006.01) | |

(52) U.S. Cl.
CPC ...... *H01L 29/495* (2013.01); *H01L 21/28273* (2013.01); *H01L 29/0673* (2013.01); *H01L 29/42324* (2013.01)

(58) Field of Classification Search
CPC ....... H01L 29/51; H01L 29/513; H01L 29/79; H01L 29/792; H01L 29/06; H01L 29/067; H01L 29/0673; H01L 29/42; H01L 29/423; H01L 29/4232; H01L 29/42324; H01L 29/49; H01L 29/495
USPC .......................................... 257/325; 438/591
See application file for complete search history.

(56) References Cited

U.S. PATENT DOCUMENTS

| | | | |
|---|---|---|---|
| 7,002,206 B2 | 2/2006 | Lai | |
| 7,045,851 B2 | 5/2006 | Black | |
| 7,482,651 B2 | 1/2009 | Bhattachrayya | |
| 8,063,430 B2* | 11/2011 | Hong | B82Y 10/00 257/315 |
| 8,139,393 B2 | 3/2012 | Lai | |
| 2006/0083694 A1* | 4/2006 | Kodas | B01J 13/0043 424/46 |
| 2007/0187768 A1* | 8/2007 | Duan | B82Y 10/00 257/368 |
| 2009/0243048 A1* | 10/2009 | Dufourcq | C23C 16/402 257/632 |

FOREIGN PATENT DOCUMENTS

EP    1744322 A1    1/2007

* cited by examiner

*Primary Examiner* — Monica D Harrison
(74) *Attorney, Agent, or Firm* — Renner Kenner Greive Bobak Taylor & Weber (57) ABSTRACT

An electronic device for data storage and a method of producing an electronic device for data storage includes a memory storage element arranged to represent two or more memory states of the electronic device; wherein the memory storage element includes a plurality of metal nanoparticles.

9 Claims, 9 Drawing Sheets

ELECTRONIC DEVICE FOR DATA STORAGE AND A METHOD OF PRODUCING AN ELECTRONIC DEVICE FOR DATA STORAGE

TECHNICAL FIELD

The present invention relates to an electronic device for data storage and a method of producing an electronic device for data storage and particularly, although not exclusively, to a method for producing an electronic memory device with a layer of metal nanoparticles implemented as the memory storage element of the memory device.

BACKGROUND

Electronic memory device are widely used in various types of electronic devices, including computers, mobile phones, digital cameras and recorders, or even in household appliances with pre-set operation programme. A memory device may temporally or permanently store data in electronic form in a memory storage element, and the stored data may be retrieved after a period of time.

Non-volatile memory device is a type of memory device which may retain the data in electronic form for a long period of time even after the power source of the memory device is cut off. Stored data may be retrieved by "reading" the memory storage element of the memory device when the power is on again. For example, images captured by a digital camera may be stored in a flash memory device, and the images may be retrieved from the flash memory using another electronic device such as a computer with an appropriate flash memory reader.

SUMMARY

In accordance with a first aspect of the present invention, there is provided an electronic device for data storage comprising a memory storage element arranged to represent two or more memory states of the electronic device; wherein the memory storage element includes a plurality of metal nanoparticles.

In an embodiment of the first aspect, the metal nanoparticles are formed as a monolayer.

In an embodiment of the first aspect, each of the metal nanoparticles comprises a metal shell and a metal core.

In an embodiment of the first aspect, the metal shell is arranged to encapsulate the metal core.

In an embodiment of the first aspect, the metal shell comprises a first metal material, and the metal core comprises a second metal material different from the first metal material.

In an embodiment of the first aspect, each of the first metal material and the second metal material includes at least one of Au, Ag, Pt, Pd, Ni and Cu.

In an embodiment of the first aspect, further comprises a semiconductor element arranged to cooperate with the memory storage element in response to an operation of the electronic device.

In an embodiment of the first aspect, the memory storage element is arranged to modulate an electrical current passing through the semiconductor element based on different states of the electronic device.

In an embodiment of the first aspect, the semiconductor element comprises a metal-oxide semiconductor.

In an embodiment of the first aspect, further comprises a first dielectric layer sandwiched between the semiconductor element and the memory storage element.

In an embodiment of the first aspect, further comprises a second dielectric layer sandwiched between the memory storage element and a conductor layer deposited on a substrate.

In an embodiment of the first aspect, wherein the substrate is a flexible substrate.

In an embodiment of the first aspect, the first dielectric layer and/or the second dielectric layer comprises a metal-oxide material.

In an embodiment of the first aspect, each of the metal nanoparticles comprises a diameter in a range of 10 nm to 20 nm.

In an embodiment of the first aspect, the electronic device is a non-volatile memory device.

In an embodiment of the first aspect, the electronic device is rewritable.

In accordance with a second aspect of the present invention, there is provided a method of producing an electronic device for data storage, including the steps of: depositing a memory storage element on a substrate of the electronic device; wherein the memory storage element is arranged to represent two or more memory states of the electronic device; and wherein the memory storage element comprises a plurality of metal nanoparticles.

In an embodiment of the second aspect, each of the metal nanoparticles comprises a metal shell and a metal core.

In an embodiment of the second aspect, further comprising the step of producing the metal nanoparticles including the steps of:
  producing the metal cores of the nanoparticles; and
  producing the metal shells arranged to encapsulate the metal cores of the nanoparticles.

In an embodiment of the second aspect, the step of depositing a memory storage element on a substrate of the electronic device comprising the steps of:
  producing a monolayer of nanoparticles; and
  transferring the monolayer of nanoparticles produced to the substrate.

In an embodiment of the second aspect, the step of transferring the monolayer of nanoparticles produced to the substrate comprising the steps of:
  attaching the monolayer of nanoparticles produced to a PDMS surface;
  contacting and attaching the monolayer of nanoparticles to the substrate; and
  detaching the PDMS surface from the monolayer of nanoparticles attached to the substrate.

In an embodiment of the second aspect, the step of producing a monolayer of nanoparticles comprising the steps of mixing a solution containing the nanoparticles with water and chloroform.

In an embodiment of the second aspect, the monolayer of nanoparticles is produced at an interface between water and chloroform.

In an embodiment of the second aspect, the step of producing a monolayer of nanoparticles comprising the step of dispersing a solution containing the nanoparticles on a water surface.

In an embodiment of the second aspect, the monolayer of nanoparticles is produced at the water surface after a complete evaporation of a solvent of the solution containing the nanoparticles.

In an embodiment of the second aspect, the substrate comprises a first dielectric layer on a first conductive layer, and the memory storage element is deposited on the first dielectric layer on the substrate.

In an embodiment of the second aspect, further comprising the step of depositing a second dielectric layer on the memory storage element.

In an embodiment of the second aspect, further comprising the step of depositing a semiconductor layer on the second dielectric layer.

In an embodiment of the second aspect, further comprising the step of depositing a second conductive layer on the semiconductor layer, wherein the first conductive layer and the second conductive layer are arranged to form a plurality of electrical electrodes of the electronic device.

In an embodiment of the second aspect, wherein the substrate is a flexible substrate.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the present invention will now be described, by way of example, with reference to the accompanying drawings in which.

DETAILED DESCRIPTION OF THE PREFERRED EMBODIMENT

The inventors have, through their own research, trials and experiments, devised that, multi-bit (multi-level or multiple data-level) flash memory based on solution-processed printing technology is important for technology application. Conventional flash floating gate memories in which only two bit data storage can be achieved are mainly based on silicon technology and have technical hurdles in transferring to flexible substrates. In this invention, uniform monolayer of metal core-shell nanoparticle array with ultra-high density may be utilized as charge trapping layer for the application in flash memory.

The solution processed core-shell metal nanoparticles are used as ink to be fabricated as large-area closely packed 2D array on the flexible substrate at low temperature. Compared with conventional technology, multi-bit data storage and larger memory window is obtained due to the enhanced trapping site and almost no lateral leakage.

Figure 1:
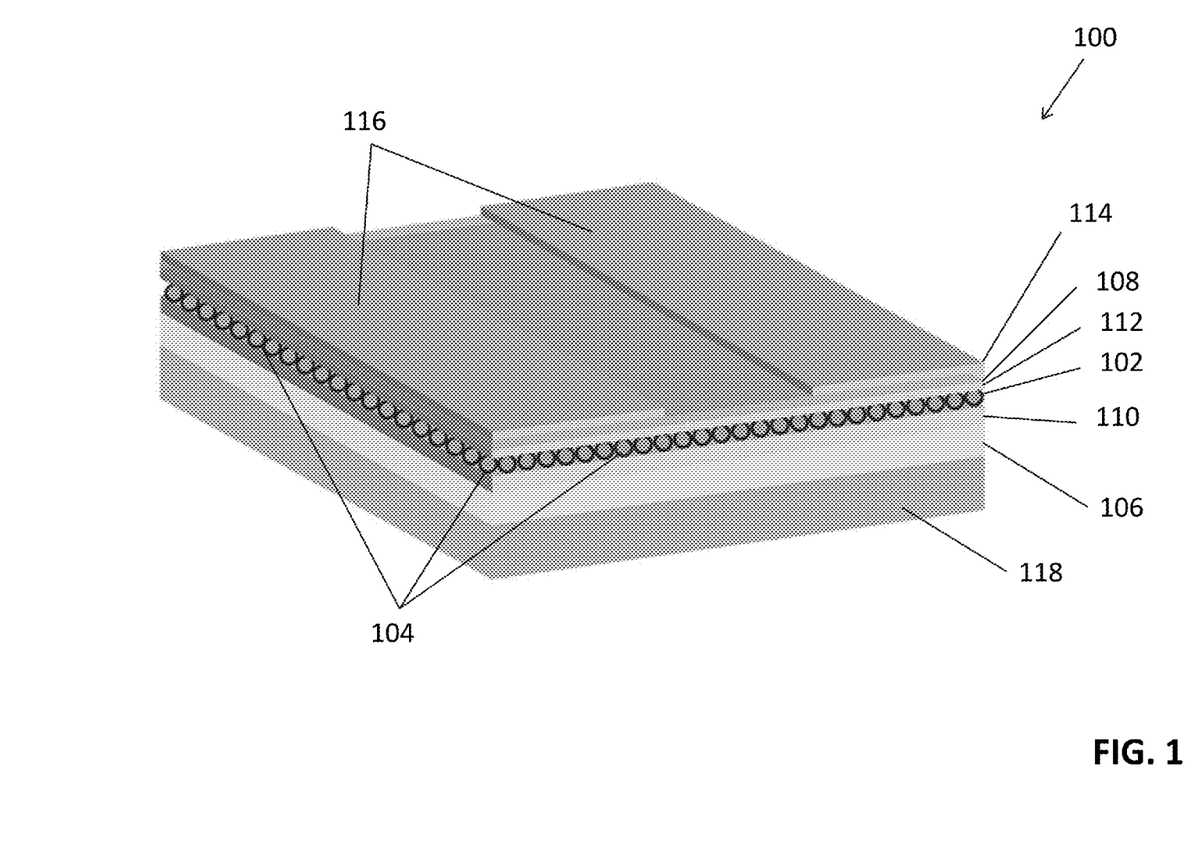
FIG. 1 is an illustration of the electronic device for data storage in accordance with an embodiment of the present invention.

Referring to FIG. 1, there is provided an embodiment of an electronic device 100 for data storage comprising a memory storage element 102 arranged to represent two or more memory states of the electronic device 100; wherein the memory storage element 102 includes a plurality of metal nanoparticles 104.

In this embodiment, the electronic device 100 may be considered as a transistor with a floating gate form by a layer of conductive material. In such floating gate transistor structure, the floating gate 106 is separated from the semiconductor material 108 by three layers of material, which includes two barrier layers (110, 112) and a charge trapping layer 102. Another electrical conductive layer 114 is deposited on the other side of the semiconductor layer 108 and is further patterned to form the source and drain terminals 116 of the floating gate transistor 100. The whole device may be fabricated on a substrate 118.

In an example embodiment, the electronic device 100 is fabricated starting with a substrate 118. The substrate 118 is preferably a flexible substrate such as Polyethylene terephthalate (PET) substrate. The PET substrate may be pre-deposited with a layer of conductive material 106 such as indium doped tin-oxide (ITO), or alternatively, the layer of conductive material 106 or conductive metal-oxide may be deposited on a bare substrate 118. The gate material 106 may be deposited to substrates 118 by methods such as thermal evaporation, spin coating, printing, chemical vapour deposition, sputtering, pulsed laser deposition, or any other deposition method as known by a person skilled in the art.

This conductive layer of material 106 is then patterned to form the gate of the floating-gate transistor 100. The patterning may be achieved by selective chemical etching of a conformal conductive layer 106 using photolithography, or the pattern is formed directly during the deposition process using methods such as imprinting, reverse-imprinting, screen printing, physical/chemical vapour deposition with shadow masks, etc. Alternatively, this conductive layer of gate material 106 may contain no patterns in some embodiments.

Alternatively, the substrate 118 may be selected from other types of flexible material such as polyethylene naphthalate (PEN) or polyimides (PI), or the substrate may be a rigid substrate such as silicon or glass wafers.

The barrier layers (110, 112) are electrically non-conductive so as to block electrical current from passing through the barrier layers (110, 112) directly. Preferably, the barrier layers (110, 112) may be dielectric layers, which may comprises a metal-oxide material, such as but not limited to $Al_2O_3$, $SiO_2$, $HfO_2$, $ZrO_2$, or any other dielectric material which may be suitable for blocking electrical current from passing through, such as polymer dielectric, composite dielectric, self-assembly monolayer dielectric etc.

Preferably, a first layer of $Al_2O_3$ (a first dielectric layer) 110 is deposited on the gate electrode 106 using atomic layer deposition (ALD) method, and this first layer of $Al_2O_3$ 110 forms the "gate oxide" of the floating gate transistor 100. Alternatively, a dielectric layer material different from $Al_2O_2$ may be deposited to form the "gate oxide" 110 of the transistor 100, and alternative methods such as spin coating, printing, sputtering, pulsed laser deposition, physical/chemical vapour deposition may be used for the deposition of the dielectric layer 110.

The memory storage element 102 of the electronic device 100 for data storage is arranged to represent two or more memory states (or logic states) of the electronic device 100. For example, in binary logic, a memory device may represent logic states of "0" or "1" (two states) in a 1-bit binary logic environment. A memory device may also be arranged to represent more than two memory states, such as logic states of "00", "01", "10" or "11" (four states) in a 2-bit binary logic environment. Such memory device is capable of representing three or more memory states may be called a multi-level memory device.

In this embodiment, the memory storage element 102 includes a plurality of metal nanoparticles 104. The term "nanoparticle (NP)", for example, refers to a particle or an object with a diameter or size in the range of 1 nm to 100 nm. Nanoparticles may also be referred as ultrafine particles. For example, an Au nanoparticle may comprise a plurality of Au atoms, and such Au nanoparticle is physically and chemically stable to exist and has a size in the range of 1 nm to 100 nm.

Preferably, the metal nanoparticles 104 are formed as a monolayer, and are deposited on the gate oxide layer 106. Each of the metal nanoparticles 104 comprises a diameter in a range of 10 nm to 20 nm so as to avoid the quantum size effects that become pronounced in nanoparticles below 5 nm, and effectively the charge trapping layer 102 formed by these metal nanoparticles 104 is about 10 nm to 20 nm thick. The memory storage element or the charge trapping layer 102 comprises a plurality of charge trapping sites arrange to trap charged particles, preferably electrons, such that the memory storage element 102 is negatively charged when electrons are trapped in the charge trapping sites. The operation of charging/discharging the charge trapping layer 102 and the interaction of the charge trapping layer 102 and the floating gate 106 transistor will be described in detail in the later part of the disclosure.

In this embodiment, each of the metal nanoparticles 104 composes of two different metal materials, and forms a metal shell and a metal core. The metal shell is arranged to encapsulate the metal core, and form a metal core-metal shell nanoparticle 104. Preferably, the two different metal materials include at least one of Au, Ag, Pt, Pd, Ni and Cu. For example, the core-shell nanoparticles 104 may include (but not limited to) Pd core-Au shell, Pd core-Ag shell, Pd core-Pt shell, Pt core-Au shell, Pt core-Ag shell, Pt core-Pd shell, Au core-Ag shell, Au core-Pd shell, Au core-Pt shell, Ag core-Pd shell, Ag core-Pt shell, Ag core-Au shell, etc.

Preferably, the nanoparticles 104 may be fabricated using solution method, which includes producing the metal cores of the nanoparticles 104, and producing the metal shells arranged to encapsulate the metal cores of the NPs 104. In an example embodiment of the fabrication of Au core-Ag shell NPs 104, 50 ml of 1 mM $HAuCl_4.3H_2O$ solution was brought to the boil, and then 5 ml of 37.8 mM sodium citrate was added to the boiling solution. Boiling was continued for another 20 minutes to generate the Au NPs. Au NPs were dispersed in 1 mM TRIS buffer (pH 8.5) under stirring, which contains $AgNO_3$ solution (1.5 mM) and poly-dopamine (PDA, 1 mg/ml). The reaction was maintained under stirring for 8 hours to generate the Au core-Ag shell NPs 104.

In another example embodiment of the fabrication of Au core-Pd shell NPs 104, 50 ml of 1 mM $HAuCl_4.3H_2O$ solution was brought to the boil, and then 5 ml of 37.8 mM sodium citrate was added to the boiling solution. Boiling was continued for another 20 minutes to generate the Au NPs. Au NPs were dispersed in 1 mM TRIS buffer (pH 8.5) under stirring, which contains $PdCl_2$ solution (1.5 mM) and poly-dopamine (PDA, 1 mg/ml). The reaction was maintained under stirring for 8 hours to form the Au core-Pd shell NPs 104.

Yet in another example embodiment of the fabrication of Au core-Pt shell NPs 104, 50 ml of 1 mM $HAuCl_4.3H_2O$ solution was brought to the boil, and then 5 ml of 37.8 mM sodium citrate was added to the boiling solution. Boiling was continued for another 20 minutes to generate Au NPs. Au NPs were dispersed in 1 mM TRIS buffer (pH 8.5) under stirring, which contains $H_2PtCl_6$ solution (1.5 mM) and poly-dopamine (PDA, 1 mg/ml). The reaction was maintained under stirring for 8 hours to generate the Au core-Pt shell NPs 104.

Yet in another example embodiment of the fabrication of Ag core-Au shell NPs 104, 50 ml of 1 mM aqueous Ag (I) salt solution was mixed with 50 ml of ethanol containing 1 ml of DDA. After 2 minutes of stirring, 50 ml of toluene was added, and stirring is kept for 1 minute. Phase transfer of metal ions from water to toluene would then be completed. Transfer of Au (III) salt from water to toluene was followed in the same way. At 100° C., 1 ml of 100 mM of toluene solution of HDD was added to 20 ml of the toluene solution of Ag (I) salt, and the mixture was agitated for several minutes. 5 ml of Ag seed organosol (from step 2) in toluene were heated at 80° C. for 5 min, followed by the addition of 5 ml of toluene solution of Au (III) salt. Heating at 80° C. continued for another 20 min under magnetic stirring to generate the Ag core-Au shell NPs 104.

After the production of the metal core-shell NPs 104, the NPs 104 may be deposited on the gate dielectric layer 110 as a monolayer of such metal core-shell NPs 104, which include the steps of producing a monolayer of NPs 104 and then transferring the monolayer of NPs 104 to the gate oxide layer 110 on the substrate 118. In an example embodiment of the production of a monolayer of NPs 104, 40 µl of metal core-shell NPs 104 (produced in the as abovementioned) is added into 960 µl $H_2O$. Then, 0.5 ml chloroform was added to the mixture. With the assistance of gentle shaking for better mixing, a thin layer (monolayer) of NPs 104 was formed at the interface of two solution phases.

In another example embodiment of the production of a monolayer of NPs 104, after the fabrication of Ag core-Au shell NPs 104, the NP-containing toluene/hexane (1:1) solution is dispersed on water surface until complete evaporation of the solvent. After that, a monolayer of Ag core-Au shell NPs 104 is formed on the water surface.

Figure 2:
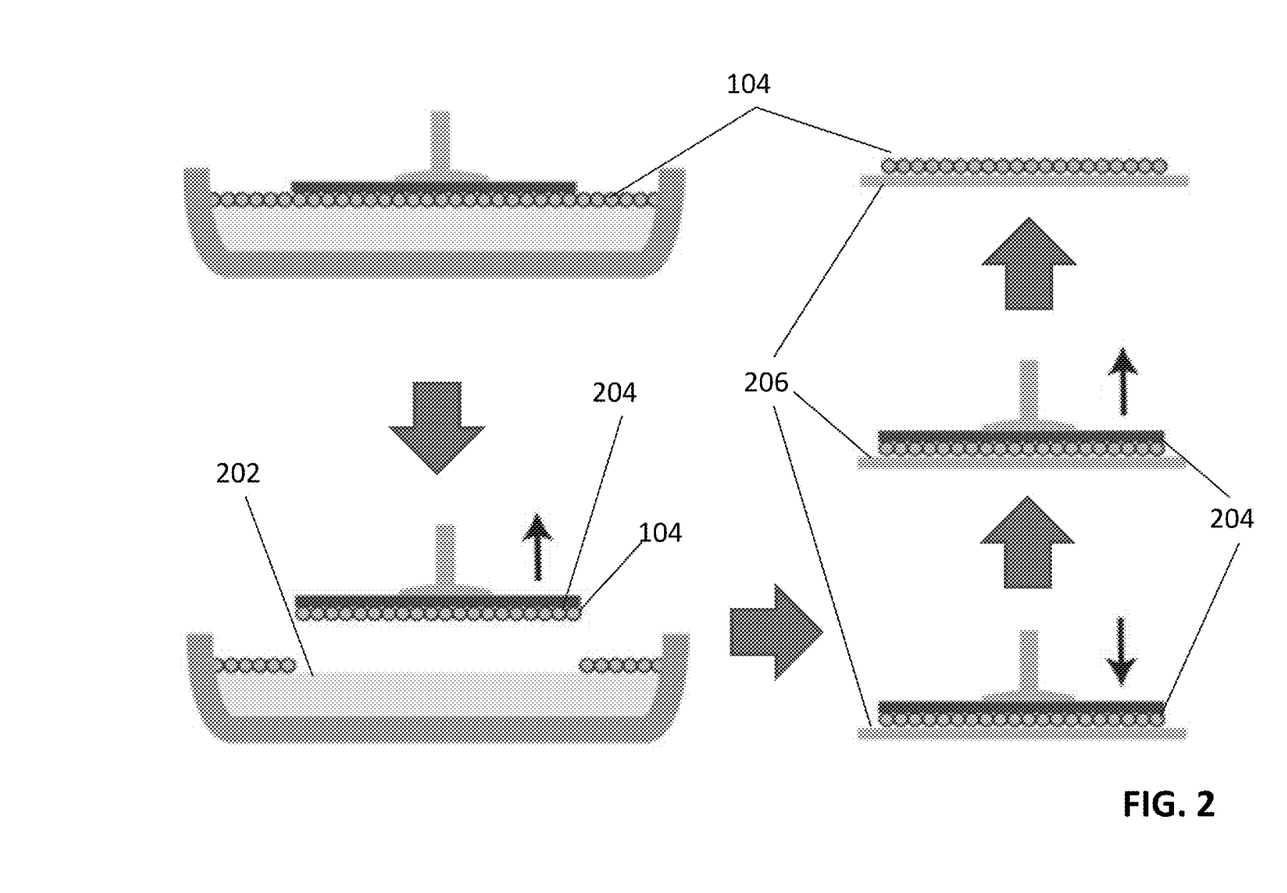
FIG. 2 is a process flow diagram of transferring of a monolayer of nanoparticles and the deposition of nanoparticles on a substrate in accordance with an embodiment of the present invention.
Figure 3:
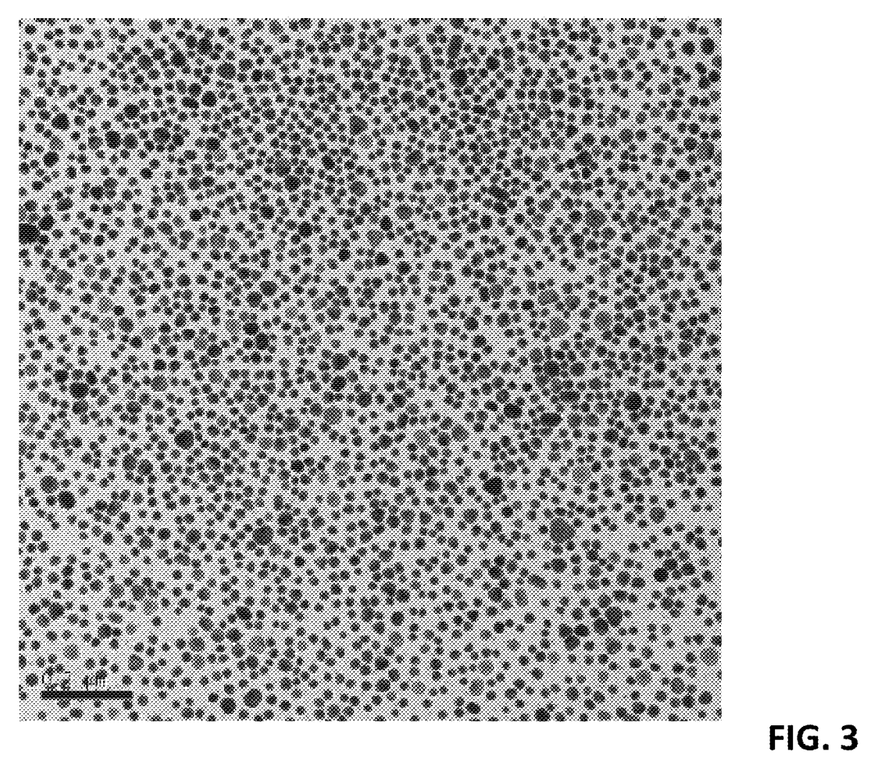
FIG. 3 is a transmission electron microscopy (TEM) image of the memory storage element of FIG. 1, the memory storage element is a monolayer of a plurality of Au core-Ag shell nanoparticles.
Figure 4:
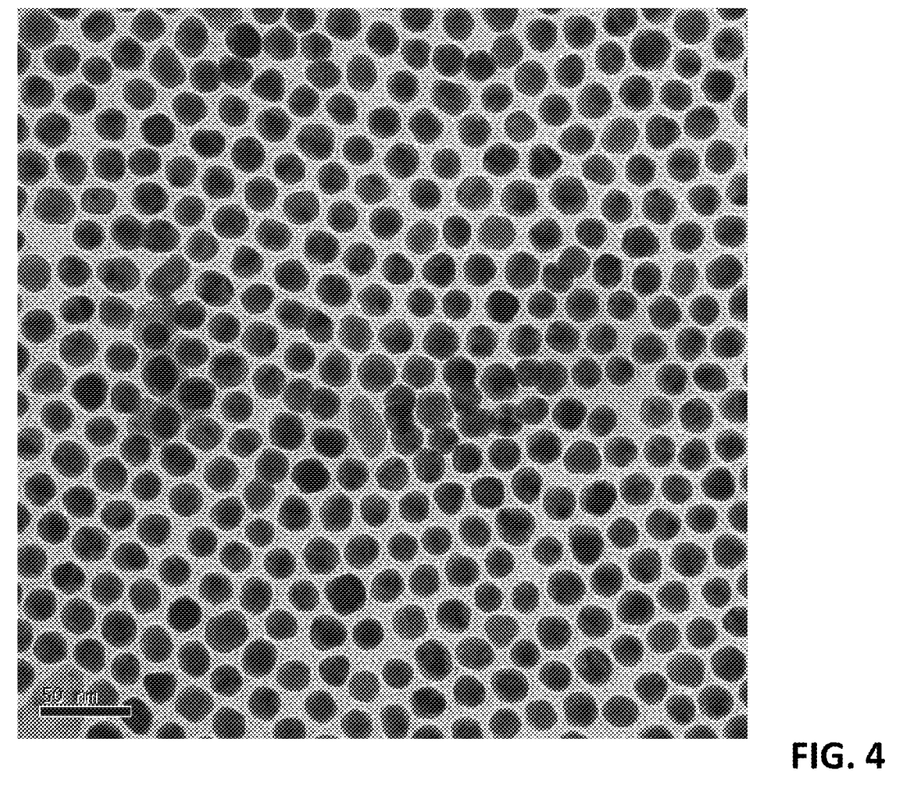
FIG. 4 is a TEM image of the memory storage element of FIG. 1, the memory storage element is a monolayer of a plurality of Au core-Pd shell nanoparticles.
Figure 5:
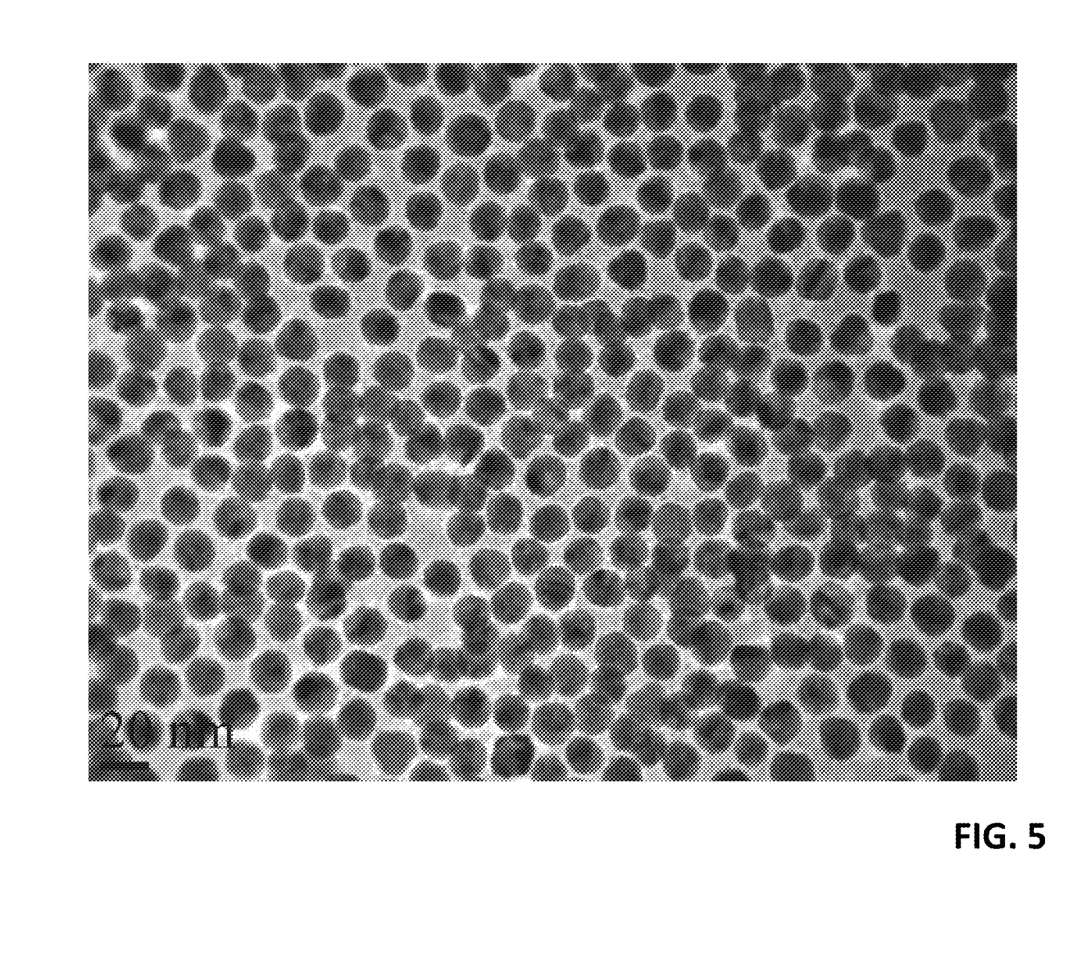
FIG. 5 is a TEM image of the memory storage element of FIG. 1, the memory storage element is a monolayer of a plurality of Au core-Pt shell nanoparticles.
Figure 6:
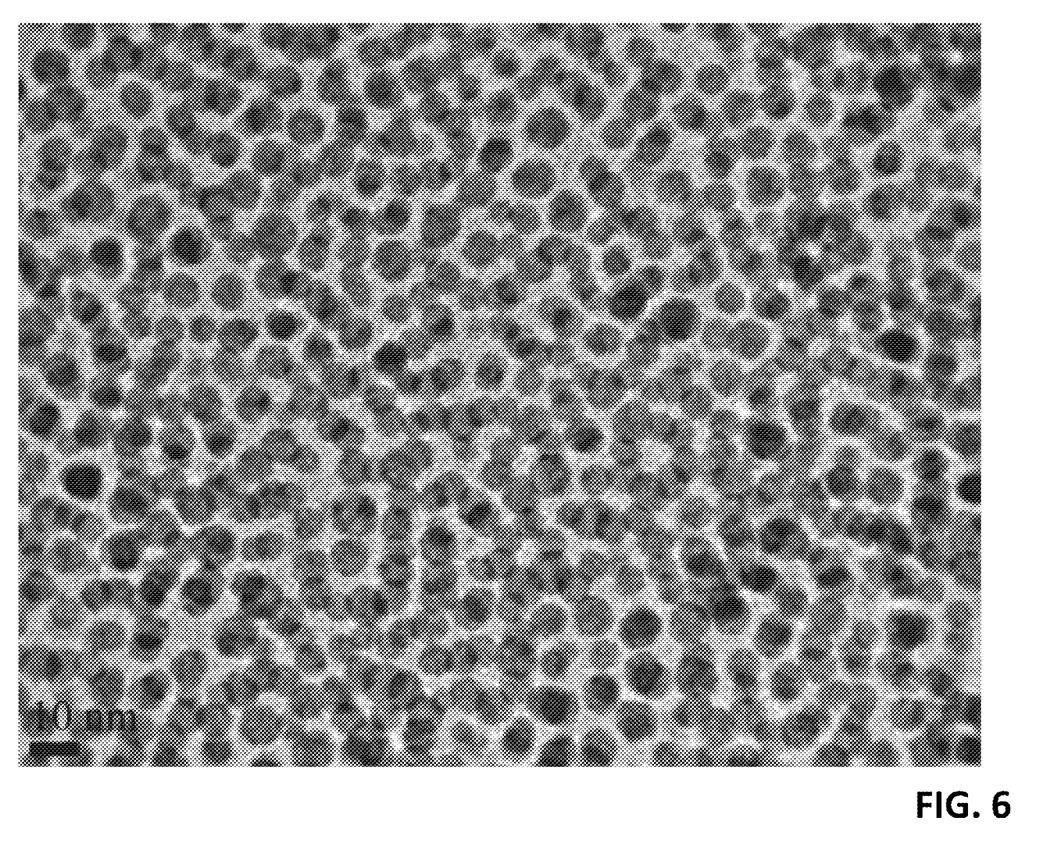
FIG. 6 is a TEM image of the memory storage element of FIG. 1, the memory storage element is a monolayer of a plurality of Ag core-Au shell nanoparticles.

With reference to FIG. 2, the monolayer of NPs 104 may be deposited to the substrate using micro-contact printing. In this example, the monolayer of NPs 104 is lifted from the water surface 202 by attaching the monolayer of nanoparticles 104 produced to a PDMS surface 204, contacting and attaching the monolayer of nanoparticles 104 to the substrate 206, and then detaching the PDMS surface 204 from the monolayer of nanoparticles 104 attached to the substrate 206. Preferably, a flat PDMS pad 206 may be used for lifting the monolayer of NPs 104 from the water surface 202 or the water/chloroform interface and then brought into conformal contact with the substrate 206 for about a predetermined period of time, such as 10 seconds. The TEM images of monolayers of Au core-Ag shell NPs, Au core-Pd shell NPs, Au core-Pt shell NPs and Ag core-Au shell NPs are shown in FIGS. 3 to 6 respectively.

Alternatively, the charge trapping layer 102 or the metal nanoparticles 104 may be deposited to the gate dielectric layer 110 on the substrate 118 by other methods such as spin coating or thermal evaporation, or any other deposition methods as known by a person skilled in the art.

Referring back to FIG. 1, on top of the charge trapping layer 102 or the memory storage element 102, a second dielectric layer 112, preferably a layer of material which is the same as the first dielectric layer 110 of the gate oxide layer underneath the charge trapping layer 102, such as $Al_2O_3$, may be deposited on the charge trapping layer 102. In this structure, the charge trapping layer 102 is sandwiched between two dielectric layers (110, 112). The second dielectric layer may be considered as a tunnel oxide layer 112 in a floating gate transistor 100, which allows charges to tunnel through between the semiconductor material 108 and the charge trapping layer 102, but blocks direct electrical current passing through. Alternatively, the second dielectric layer 112 may be formed with a dielectric material or electrically non-conductive material different from the first dielectric layer 110. Similarly, the second dielectric layer 112 may be deposited by using ALD, or by another suitable method for depositing a dielectric layer as previously mentioned in the disclosure.

After the deposition of the second dielectric layer 112, a layer of semiconductor 108, preferably ZnO, may be deposited on the dielectric layer 112 on the substrate 118. The semiconductor layer 108 serves as the active layer in the electronic device 100. This semiconductor element 108 is arranged to cooperate with the memory storage element 102 in response to an operation of the electronic device 100. The layer of ZnO may be deposited using a solution process, such as spin coating. Alternatively, other semiconductor material (such as but not limited to organic semiconductor, inorganic semiconductors, or composite semiconductors) may be applied by using various suitable methods, including spin coating, printing, thermal evaporation, physical/chemical vapour deposition, sputtering, pulsed laser deposition, etc.

To complete the floating gate transistor structure, a layer of conductive material 114 is deposited on the semiconductor layer 108 to form the source/drain terminals 116 of the electronic device 100. In this embodiment, a layer of ITO 114 is deposited on ZnO semiconductor layer 108, which may be further patterned by selective chemical etching using photolithography method (or other patterning method as previously mentioned in the disclosure). Alternatively, other materials with appropriate work functions, which may form a desire ohmic contact, near-ohmic contact or tunnelling-ohmic contact with a corresponding semiconductor material deposited as active layer, such as conductive metal-oxide, conductive polymer, metal or graphene, may be used as the source/drain terminal 116 of the electronic device 100.

Optionally, a plurality of electronic device 100 may be integrated to form a memory device with a larger memory size. Additionally, other types of electronic devices such as controllers and antennas may be integrated or connected to the memory device 100 to provide additional functions. Alternatively, one or more electronic devices 100 may be integrated to other electronic devices or integrated circuits to provide memory functions to these electronic devices or integrated circuits.

In one example embodiment, the size of metal core-shell nanoparticles 104 around 10 nm to 20 nm to avoid the quantum size effects that become pronounced in nanoparticles 104 below 5 nm. One particular type of core-shell nanoparticles 104, selected from Pd core-Au shell, Pd core-Ag shell, Pd core-Pt shell, Pt core-Au shell, Pt core-Ag shell, Pt core-Pd shell, Au core-Ag shell, Au core-Pd shell, Au core-Pt shell, Ag core-Pd shell, Ag core-Pt shell and Ag core-Au shell, forms the memory storage element 102. The flexible substrate 118 deposited with $Al_2O_3$ layer 110 was washed, preferably by acetone, ethanol and deionized water. The fabrication method of 2D core-shell nanoparticle super lattices is by controlling the evaporation of nanoparticles 104 dispersed in a binary solvent mixture on the deionized water surface. The core-shell nanoparticle self-assembled monolayer were obtained by spreading nanoparticle solution onto the surface of the concave deionized water, the Langmuir film was then lifted from the water surface using a flat PDMS pad and then this pad is brought into conformal contact with the substrate for about 10 seconds. Memory devices 100 were fabricated on flexible film 118 with 100 nm indium tin oxide (ITO) 106 as gate electrode. $Al_2O_3$ layers (110, 112) were deposited using a Savannah 100 ALD system at a substrate temperature of 80° C. Solution processed metal oxide semiconductor (such as ZnO) 108 was used as the active layer in the memory structure 100. ITO layer 114 was used as the source and drain electrodes 116.

Each of the layers of the electronic device 100 as shown in FIG. 1 may be in a range of preferable thickness. For example, the thickness of the gate electrode 106 may be about 20 nm to 40 nm, the thickness of the dielectric layers (110, 112) may be about 20 nm to 50 nm, the thickness of the semiconductor layer 108 may be about 10 nm to 40 nm, the thickness of the charge trapping layer 102 may be about 10 nm to 20 nm, and the thickness of the source/drain layer 114 may be about 20 nm to 50 nm. Alternatively, to optimize the electronic device 100 based on different fabrication processing method or the desired operation of the electronic device 100, other suitable thickness of each of the individual layers may be applied.

Advantageously, long retention time and good endurance property can be achieved in the electronic device for data storage. The printable metal core-shell nanoparticle monolayer through micro-contact printing technique has great potential for scaling down the current state-of-art flash memory devices. The key device elements (core-shell nanoparticles) are fabricated via low temperature processes, which can be readily adopted on plastic substrates. The dielectric layer as well as the semiconductor layer can also be fabricated at low temperature which is extendable for low-cost large area fabrication of flexible flash memories. In addition, since plastic substrate may provide excellent mechanical stiffness, the memory devices supported by the flexible substrate is also provided with excellent mechanical property, and hence enhancing the data retention time and endurance property.

Such embodiments are also advantages in that, the electronic device for data storage is suitable for fabricating on various kind of substrate including flexible substrates. This allows the memory device to be deposited, mounted, or even directly printed on substrates such as RFID tags, flight tickets, portable electronic devices or even specially designed electronic apparatus with curved surfaces. In addition, these embodiments may operate in low voltage which is more suitable for applications such as passive tags. Lower programming voltage may also require simpler driving controllers.

Additionally, the electronic device for data storage may be fabricated with low temperature processes and minimized steps involving vacuum processes. In some preferred embodiments, the fabrication processes mostly involve solution processes, and the deposition of the key element (the charge trapping layer) involve micro-contact printing. Unlike silicon device fabrication which highly depends on high vacuum and high temperature processes, the processing window is much wider which lead to possibly higher yield. Low temperature processes also allow the use of a much wider range of substrates, including flexible plastic or paper substrates.

Figure 7:
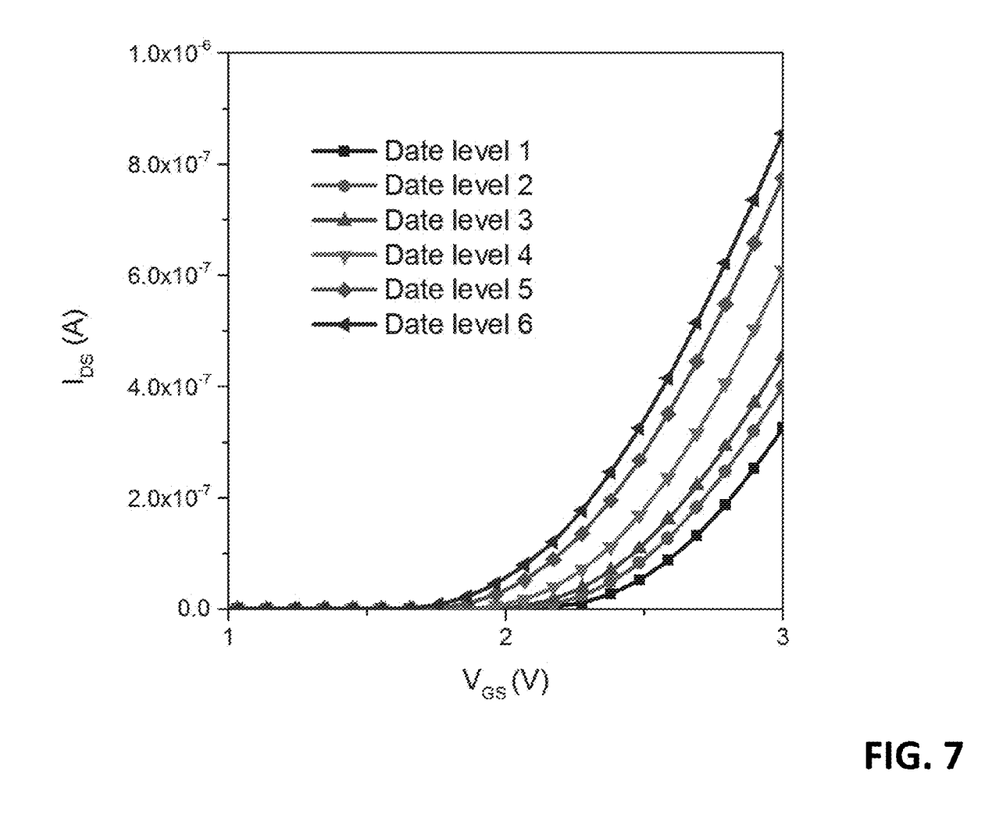
FIG. 7 is a plot showing a current-voltage characteristic of the electronic device for data storage of FIG. 1 operating in six different memory states.

With reference to FIG. 7, there is shown a current-voltage characteristic of the electronic device 100 for data storage in accordance with an embodiment of the present invention. In this embodiment, the electronic device 100 is arranged to represent six data levels or memory states.

In a programming or writing operation, a positive voltage bias is applied between the gate and the source terminals, to drive electrons tunnelling through the tunnel oxide and the electrons are trapped in the charge trapping layer 102. Higher the voltage bias applied between the gate and the source, more electrons are trapped in the charge trapping layer 102. In the embodiment as shown in FIG. 7, six different positive voltage bias is applied between the gate and the source terminals to record six different memory states. For example, to programme the memory device 100, a gate-source bias of 6 V may be applied for 1 second to record a memory state representing data level 1, 5 V may be applied for 1 second to record a memory state representing data level 2, 4 V may be applied for 1 second to record a memory state representing data level 3, 3 V may be applied for 1 second to record a memory state representing data level 4, 2 V may be applied for 1 second to record a memory state representing data level 5, and the uncharged memory device may represent a memory state of data level 6 respectively. Alternatively, based on different writing and/or reading methodology or algorithm, gate bias and/or bias duration may be applied to programme the memory device 100 to a memory state representing a predetermined data level.

In the read operation, positive voltage bias (2V) is applied between the gate and the source terminal, positive voltage bias (3V) is applied between the drain and the source terminal. The operation is based on the I-V curve at $V_{GS}=2$ V. Since the memory device 100 is previously programmed by injecting negatively charged electrons in the charge trapping layer 102 underneath the gate electrode 106, the applied positive gate bias is partially compensated by the negatively charged charge trapping layer, and hence the "effective gate bias" is lower than the applied gate bias, and the difference is dependent on the amount of charges trapped in the charge trapping layer, and hence the memory storage element is arranged to modulate an electrical current passing through the semiconductor element 108 based on different states of the electronic device. In such reading operation, the six data level is read as: Data level 1 (1.6E-11 A), Data level 2 (1.1E-10 A), Data level 3 (7.7E-10 A), Data level 4 (5.6E-9 A), Data level 5 (2.5E-8 A), Data level 1 (4.6E-8 A). Alternatively, other read algorithm, such as reading by applying different $V_{GS}$ and/or $V_{DS}$ may be applied, and the memory device may represent a number of data levels different from six, based on different writing and reading operation.

In the erase operation, sufficient negative voltage bias is applied between the gate and the source terminal (such as a gate-source bias of −6 V for 1 second), electrons are released from the charge trapping layer 102 to the semiconductor layer 108. As a result, the memory device 100 is reverted back to the uncharged states and is rewritable or reprogrammable. Alternatively, based on different writing and/or erasing methodology or algorithm, gate bias and/or bias duration may be applied to erase the memory device 100 to a state ready for reprogramming.

Figure 8:
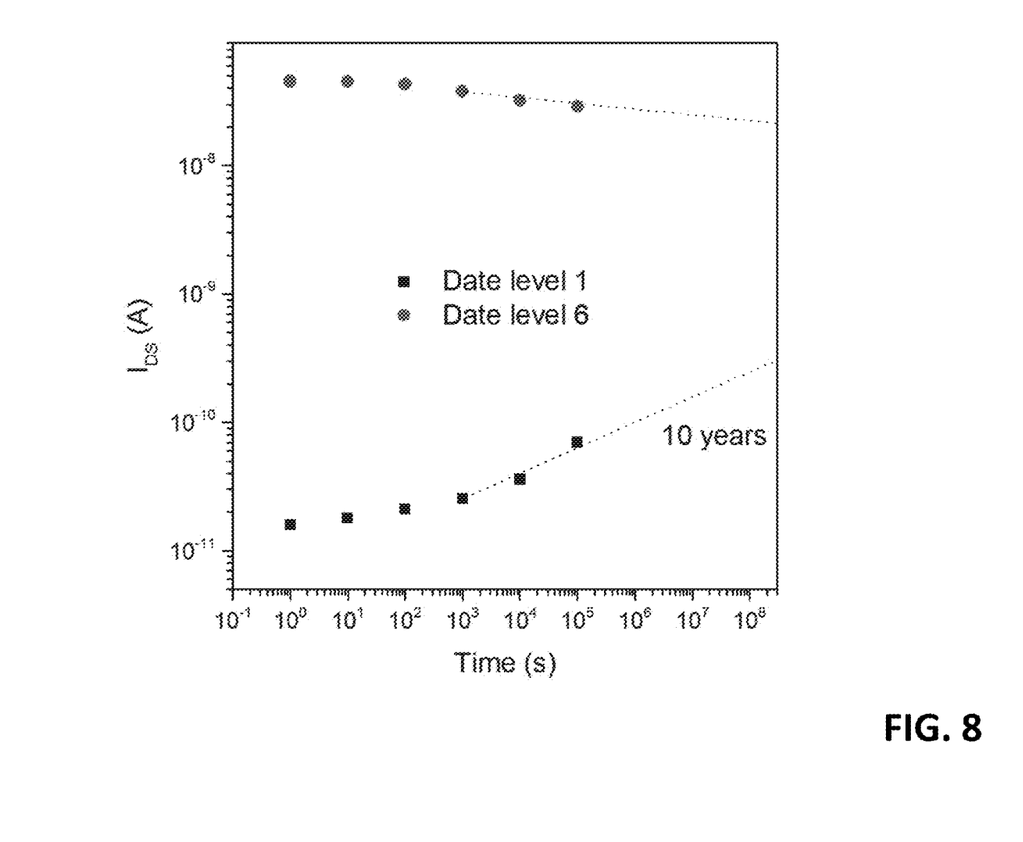
FIG. 8 is a plot showing the date retention property of the electronic device for data storage of FIG. 1.

With reference to FIG. 8, there is shown the data retention property of the electronic device 100 for data storage. In this test, the electronic device 100 is written with data level 1 and data level 6 and the device is read at 10, 100, 1000, 10000, 100000 and 1000000 seconds respectively after programming. The data plot is extrapolated to about $3\times10^9$ seconds, which represent a period of 10 years after programming. The results show that the difference between estimated currents representing two different data levels are sufficiently large enough (more than 2 orders of magnitude) which suggests that the data retention property of the multi-level memory device is excellent, and the electronic device 100 is a non-volatile memory device.

Figure 9:
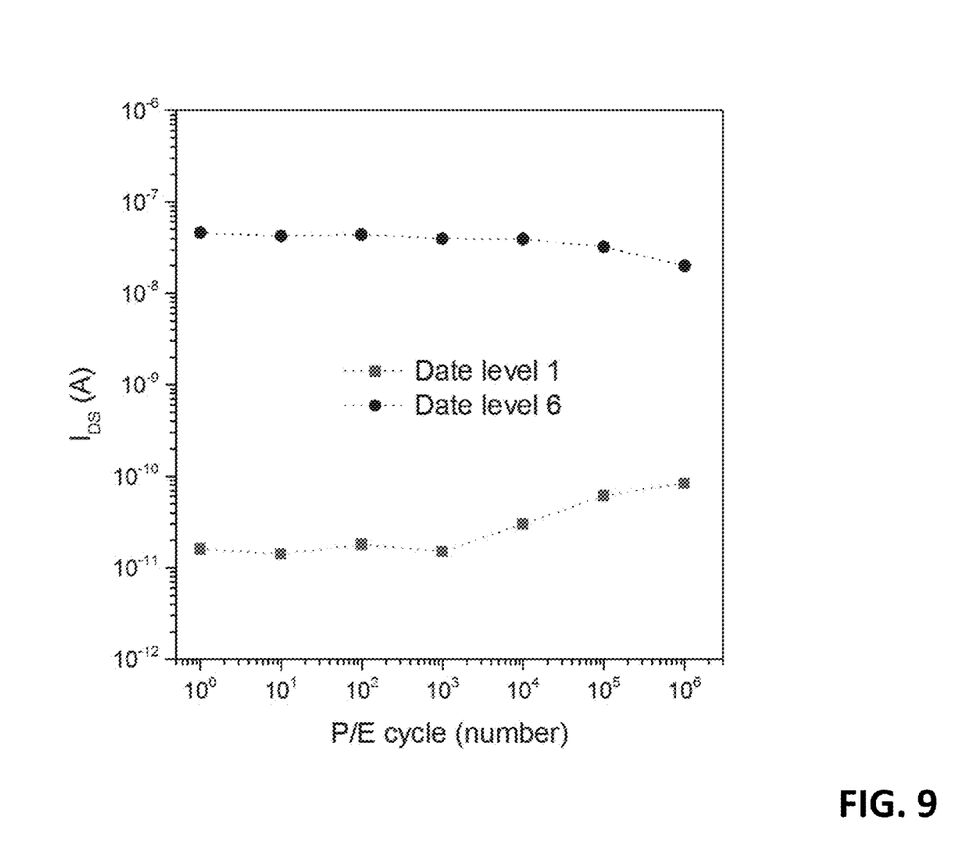
FIG. 9 is a plot showing the program-erase (P/E) endurance property of the electronic device for data storage of FIG. 1.

With reference to FIG. 9, there is shown the program-erase (P/E) endurance property of the electronic device 100 for data storage. In this test, read operations are carried out after certain program/erase cycling test (1, 10, 100, 1000, 10000, 100000, 1000000), in which one cycling test is defined as first programming the electronic device 100 at a positive gate bias then erase at a negative gate bias. The results show that after 1000000 P/E cycles, the difference between the two measured currents representing two different data levels (level 1 and level 6) are sufficiently large (more than 2 orders of magnitude), which suggests that the P/E endurance property of the multi-level memory device is excellent, and the electronic device 100 is rewritable.

Without deviating from the spirit of the invention, the electronic device for data storage may be modified to include other transistor structures. In some embodiments, the memory device can be arranged to operate as non-rewritable storage, temporary storage, or any other usage as known by a person skilled in the art.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method of producing an electronic device for data storage comprising the steps of:
   producing a plurality of metal nanoparticles, wherein the plurality of metal nanoparticles each include a metal core and a metal shell, said step of producing a plurality of metal nanoparticles including the steps of:
      producing the metal cores of the metal nanoparticles; and
      producing the metal shells arranged to encapsulate the metal cores of the metal nanoparticles; and
   depositing a memory storage element on a substrate of the electronic device; wherein the memory storage element includes the plurality of metal nanoparticles; wherein the memory storage element is arranged to represent two or more memory states of the electronic device; and wherein the step of depositing the memory storage element on the substrate of the electronic device comprises the steps of:
      producing a monolayer of the plurality of metal nanoparticles; and thereafter
      transferring the produced monolayer the substrate.

2. A method of producing an electronic device for data storage in accordance with claim 1, wherein the step of transferring the monolayer of nanoparticles produced to the substrate comprising the steps of:
- attaching the monolayer of nanoparticles produced to a PDMS surface;
- contacting and attaching the monolayer of nanoparticles to the substrate; and
- detaching the PDMS surface from the monolayer of nanoparticles attached to the substrate.

3. A method of producing an electronic device for data storage in accordance with claim 1, wherein the step of producing a monolayer of nanoparticles comprising the step of mixing a solution containing the nanoparticles with water and chloroform.

4. A method of producing an electronic device for data storage in accordance with claim 3, wherein the monolayer of nanoparticles is produced at an interface between water and chloroform.

5. A method of producing an electronic device for data storage in accordance with claim 1, wherein the step of producing a monolayer of nanoparticles comprising the step of dispersing a solution containing the nanoparticles on a water surface.

6. A method of producing an electronic device for data storage in accordance with claim 5, wherein the monolayer of nanoparticles is produced at the water surface after a complete evaporation of a solvent of the solution containing the nanoparticles.

7. A method of producing an electronic device for data storage in accordance with claim 1, wherein the substrate is flexible.

8. A method of producing an electronic device for data storage comprising the steps of:
- producing a plurality of metal nanoparticles;
- depositing a memory storage element on a substrate of the electronic device, wherein the memory storage element is arranged to represent two or more memory states of the electronic device, wherein the memory storage element includes the plurality of metal nanoparticles, wherein the substrate comprises a first dielectric layer on a first conductive layer, and the memory storage element is deposited on the first dielectric layer on the substrate;
- depositing a second dielectric layer on the memory storage element;
- depositing a semiconductor layer on the second dielectric layer; and
- depositing a second conductive layer on the semiconductor layer, wherein the first conductive layer and the second conductive layer are arranged to form a plurality of electrical electrodes of the electronic device.

9. A method of producing an electronic device for data storage in accordance with claim 8, wherein the substrate is flexible.

* * * * *